(12) United States Patent
Sun et al.

(10) Patent No.: US 9,791,483 B2
(45) Date of Patent: Oct. 17, 2017

(54) ELECTRICAL CIRCUIT AND A METHOD FOR MEASURING THE POWER CONSUMPTION OF AN LED LIGHTING DEVICE

(71) Applicant: ZHEJIANG SHENGHUI LIGHTING CO., LTD, Jiaxing (CN)

(72) Inventors: Chaoqun Sun, Jiaxing (CN); Jinxiang Shen, Jiaxing (CN)

(73) Assignee: ZHEJIANG SHENGHUI LIGHTING CO., LTD, Jiaxing (CN)

( * ) Notice: Subject to any disclaimer, the term of this patent is extended or adjusted under 35 U.S.C. 154(b) by 355 days.

(21) Appl. No.: 14/385,253

(22) PCT Filed: May 5, 2014

(86) PCT No.: PCT/CN2014/076792
§ 371 (c)(1),
(2) Date: Sep. 15, 2014

(87) PCT Pub. No.: WO2015/067012
PCT Pub. Date: May 14, 2015

(65) Prior Publication Data
US 2016/0245849 A1   Aug. 25, 2016

(30) Foreign Application Priority Data
Nov. 6, 2013 (CN) .......................... 2013 1 0544277

(51) Int. Cl.
*G01R 31/00* (2006.01)
*G01R 22/06* (2006.01)
(Continued)

(52) U.S. Cl.
CPC ........... *G01R 22/063* (2013.01); *G01R 21/06* (2013.01); *G01R 31/44* (2013.01); *H05B 33/089* (2013.01);
(Continued)

(58) Field of Classification Search
CPC .. G01R 22/063; G01R 21/06; G01R 31/2635; G01R 31/44; H05B 33/089; H05B 33/0893; H05B 37/03; H05B 37/0272
(Continued)

(56) References Cited

U.S. PATENT DOCUMENTS 6,483,291 B1 * 11/2002 Bhateja .................. G01R 22/00
                                                       324/107
7,190,121 B2 * 3/2007 Rose .................. H05B 33/0818
                                                       315/129
(Continued)

FOREIGN PATENT DOCUMENTS

CN    102478641 A  *  5/2012
CN    203561690 U  *  4/2014
(Continued)

*Primary Examiner* — Patrick Assouad
*Assistant Examiner* — Sean Curtis
(74) *Attorney, Agent, or Firm* — Anova Law Group, PLLC

(57) ABSTRACT

Embodiments consistent with the present disclosure provide an electrical circuit and a method for measuring the power and power consumption of an LED lighting device in real time. The circuit includes a controlling unit configured to process data; a display unit configured to display data received from the controlling unit and other components; a power supply and driving unit configured to supply power; an LED light source; and a RF unit configured to send data to remote terminals. The electrical circuit further includes an input power sampling unit, an output voltage sampling unit, and an output current sampling unit, which are configured to capture the real time input voltage, output voltage, and output current data respectively. Further, the controlling unit may determine the power and power consumption of the LED lighting device by using the received real time voltage
(Continued)

and current data measurements, and referring to the stored input voltage-efficiency curves.

19 Claims, 2 Drawing Sheets

(51) Int. Cl.
| | |
|---|---|
| *H05B 33/08* | (2006.01) |
| *G01R 21/06* | (2006.01) |
| *G01R 31/44* | (2006.01) |
| *H05B 37/03* | (2006.01) |
| *H05B 37/02* | (2006.01) |

(52) U.S. Cl.
CPC ......... *H05B 33/0893* (2013.01); *H05B 37/03* (2013.01); *H05B 37/0272* (2013.01)

(58) Field of Classification Search
USPC .......... 324/414, 500, 522, 537, 764.01, 713, 324/76.11, 103 R; 702/1, 57, 60, 61, 64
See application file for complete search history.

(56) References Cited

U.S. PATENT DOCUMENTS

| | | | | |
|---|---|---|---|---|
| 7,233,115 B2* | 6/2007 | Lys | .................. | F21S 48/325 315/224 |
| 7,256,554 B2* | 8/2007 | Lys | .................. | F21S 48/325 315/224 |
| 7,358,706 B2* | 4/2008 | Lys | .................. | F21S 48/325 323/222 |
| 7,459,864 B2* | 12/2008 | Lys | .................. | F21S 48/325 315/219 |
| 7,557,521 B2* | 7/2009 | Lys | .................. | F21S 48/325 315/224 |
| 7,659,673 B2* | 2/2010 | Lys | .................. | F21S 48/325 315/224 |
| 7,737,643 B2* | 6/2010 | Lys | .................. | F21S 48/325 315/224 |
| 7,777,495 B2* | 8/2010 | Mannerfelt | ........... | B60Q 1/305 324/414 |
| 8,138,690 B2* | 3/2012 | Chemel | .................. | F21S 8/08 315/294 |
| 8,339,069 B2* | 12/2012 | Chemel | .............. | H05B 37/029 315/294 |
| 8,593,135 B2* | 11/2013 | Chemel | .............. | H05B 37/029 324/105 |
| 8,896,317 B2* | 11/2014 | Surdeanu | ........... | H05B 33/0866 324/519 |
| 9,049,753 B1* | 6/2015 | Wassel | ................. | H05B 37/02 |
| 9,074,736 B2* | 7/2015 | Recker | ................... | F21K 9/13 |
| 9,161,406 B2* | 10/2015 | Saes | ................. | H05B 33/0815 |
| 9,338,839 B2* | 5/2016 | Recker | ............... | H05B 33/0815 |
| 9,544,970 B2* | 1/2017 | Dunser | ............... | H05B 33/0815 |
| 2005/0213352 A1* | 9/2005 | Lys | ..................... | F21S 48/325 363/17 |
| 2005/0213353 A1* | 9/2005 | Lys | ..................... | F21S 48/325 363/17 |
| 2005/0218838 A1* | 10/2005 | Lys | ..................... | F21S 48/325 315/291 |
| 2005/0218870 A1* | 10/2005 | Lys | ..................... | F21S 48/325 323/222 |
| 2005/0219872 A1* | 10/2005 | Lys | ..................... | F21S 48/325 363/21.04 |
| 2005/0231133 A1* | 10/2005 | Lys | ..................... | F21S 48/325 315/291 |
| 2006/0038506 A1* | 2/2006 | Rose | .................. | H05B 33/0818 315/247 |
| 2007/0024213 A1* | 2/2007 | Shteynberg | ........ | H05B 33/0815 315/291 |
| 2008/0012502 A1* | 1/2008 | Lys | ..................... | F21S 48/325 315/247 |
| 2008/0224708 A1* | 9/2008 | Mannerfelt | ............ | B60Q 1/305 324/414 |
| 2011/0037455 A1* | 2/2011 | Oren | ..................... | G01D 4/004 324/103 R |
| 2012/0043889 A1* | 2/2012 | Recker | ............... | H05B 33/0815 315/86 |
| 2012/0176064 A1* | 7/2012 | Saes | ................... | H05B 33/0815 315/297 |
| 2014/0070790 A1* | 3/2014 | Fujiwara | ................ | G01R 21/00 324/76.11 |
| 2014/0103932 A1* | 4/2014 | Swenson | ................ | G01R 31/44 324/414 |
| 2015/0061638 A1* | 3/2015 | Reh | ..................... | G01R 21/001 324/76.11 |
| 2015/0130358 A1* | 5/2015 | Kim | .................... | H05B 33/0815 315/159 |
| 2015/0160275 A1* | 6/2015 | Goergen | ................ | G01R 31/44 324/414 |
| 2015/0257221 A1* | 9/2015 | McDermott | ....... | H05B 33/0812 315/210 |
| 2015/0257229 A1* | 9/2015 | Wassel | ................... | H05B 37/02 315/307 |
| 2015/0305105 A1* | 10/2015 | Yang | .................... | G09G 3/3406 315/297 |
| 2015/0373811 A1* | 12/2015 | Dunser | ............. | H05B 33/0815 315/185 R |
| 2016/0245849 A1* | 8/2016 | Sun | .................... | H05B 33/0893 |

FOREIGN PATENT DOCUMENTS

| | | | | | |
|---|---|---|---|---|---|
| CN | WO 2015067012 | A1 * | 5/2015 | ......... | H05B 33/0893 |
| CN | EP 2962121 | A1 * | 1/2016 | ......... | H05B 33/0893 |
| FR | 2939213 | A1 * | 6/2010 | ............ | B60Q 11/00 |

* cited by examiner

ELECTRICAL CIRCUIT AND A METHOD FOR MEASURING THE POWER CONSUMPTION OF AN LED LIGHTING DEVICE

CROSS-REFERENCES TO RELATED APPLICATIONS

This application is based upon and claims the priority of Chinese Patent Application No. 201310544277.6 filed on Nov. 6, 2013, the entire content of which is incorporated herein by reference.

FIELD OF THE DISCLOSURE

The present disclosure relates to the field of light emitting diode (LED) technologies and, more particularly, relates to an electrical circuit capable of monitoring real time power consumption of an LED lighting device, and relates to a method for measuring the power consumption of the LED lighting device.

BACKGROUND

LED lighting devices provide controllable light and solid-state lighting. They consume less power than traditional lighting devices, and are environmentally friendly. As a result, LEDs have been widely used for many types of lighting applications.

The traditional electrical power consumption measuring devices for residential use often measure the total power consumption of a residence. Devices that only measure power consumption of lighting devices are rare. In addition, traditional power consumption measuring devices often need specific chips and are expensive and very large, making them not suitable for home use. Moreover, traditional power consumption measuring devices cannot reflect the power consumption changes of an LED lighting device during its light adjustments and dimming processes.

The disclosed method and system are directed to solve one or more problems set forth above and other problems.

BRIEF SUMMARY OF THE DISCLOSURE

One aspect of the present disclosure provides an electrical circuit for measuring the power consumption of an LED lighting device in real time. The circuit may include an LED power supply unit configured to supply power and drive the LED lighting device; an LED light source configured to emit light; and an input voltage sampling unit configured to measure real time input voltage data. The circuit may further include an output voltage sampling unit configured to measure real time output voltage data; an output current sampling unit configured to measure real time output current data; and a controlling unit configured to calculate real time power and power consumption of the LED lighting device by using the input current and voltage data, and by referring to previously stored efficiency curves of the LED lighting device. In addition, the circuit may include a display unit configured to display the real time power and power consumption of the LED lighting device; and a RF unit configured to send the received data to remote terminals.

In addition, the display unit may be connected to the controlling unit through a wired or wireless connection and the RF unit may be connected to the controlling unit. The RF unit may send the real time LED power input, power output, and power consumption data to remote intelligent terminals, or to cloud servers.

Moreover, the controlling unit may be further configured to receive and store environmental data measurements taken by sensors on the LED lighting device, and to send the environmental data measurements to the display unit. The display unit may display the power and power consumption data together with the environmental data.

In addition, the controlling unit may be further configured to receive and store data measuring a lifespan of the LED lighting device in real time and to send the data measuring the real time lifespan of the LED lighting device to the display unit. The display unit may display the power and power consumption data together with the data measuring the real time lifespan of the LED lighting device.

Another aspect of the present disclosure provides a method for measuring the power consumption of an LED lighting device in real time. The method may include measuring input voltages-efficiency curves of the LED lighting device under different input voltages; storing the input voltage-efficiency curves of the LED lighting device under different input voltage conditions; and measuring real time input voltages of the LED lighting device. The method may further include measuring a real time output voltage of the LED lighting device; measuring a real time output current of the LED lighting device; and determining a real time power input of the LED lighting device by using the measured voltage and current data, and by referring to the stored input voltage-efficiency curves. In addition, the method may include determining the real time power consumption by doing time integration; and displaying the power and power consumption of the LED lighting device in real time. The display unit may be attached to or a part of the LED lighting device.

Moreover, the method may include sending the calculated real time power and power consumption data to an intelligent terminal through a RF unit and displaying the real time power and power consumption data on the intelligent terminal.

The method may further include measuring environment data related to operational conditions of the LED lighting device; and displaying the environmental data together with the power and power consumption data of the LED lighting device.

The method may also include measuring real time lifespan data of the LED lighting device; and displaying the real time lifespan data together with the power and power consumption data of the LED lighting device.

Another aspect of the present disclosure provides a system for measuring the power consumption of an LED lighting device in real time. The system may include a LED power supply unit configured to supply power and drive the LED lighting device; an LED light source configured to emit light; an input voltage sampling unit configured to measure real time input voltage data; and an output voltage sampling unit configured to measure real time output voltage data.

The system may also include an output current sampling unit configured to measure real time output current data; a temperature sensor (not shown) and a humidity sensor (not shown) attached to the LED lighting device, collecting environmental data related to operations of the LED lighting device in real time; a controlling unit configured to calculate real time power and power consumption of the LED lighting device by using the input current and voltage data, and by referring to previously stored voltage-efficiency curves of the LED lighting device; a display unit configured to display the real time environment data and power and power consumption of the LED lighting device; and a RF unit configure to send received data to remote terminals.

The system may further include a light intensity sensor configured to measure illuminance of the LED light source in real time. The controlling unit may be further configured to determine the lifespan of the LED lighting device in real time. Further, the display unit may be further configured to display the real time lifespan data with the power and power consumption data of the LED lighting device.

Embodiments consistent with the present disclosure enable a user to measure the power and power consumption of LED lighting devices in real time. Embodiments consistent with the present disclosure may reflect the power consumption changes during the light adjustment processes of LED lighting devices. Embodiments consistent with the present disclosure may be low cost, relatively small, and suitable for various applications of LED lighting devices.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

Figure 1:
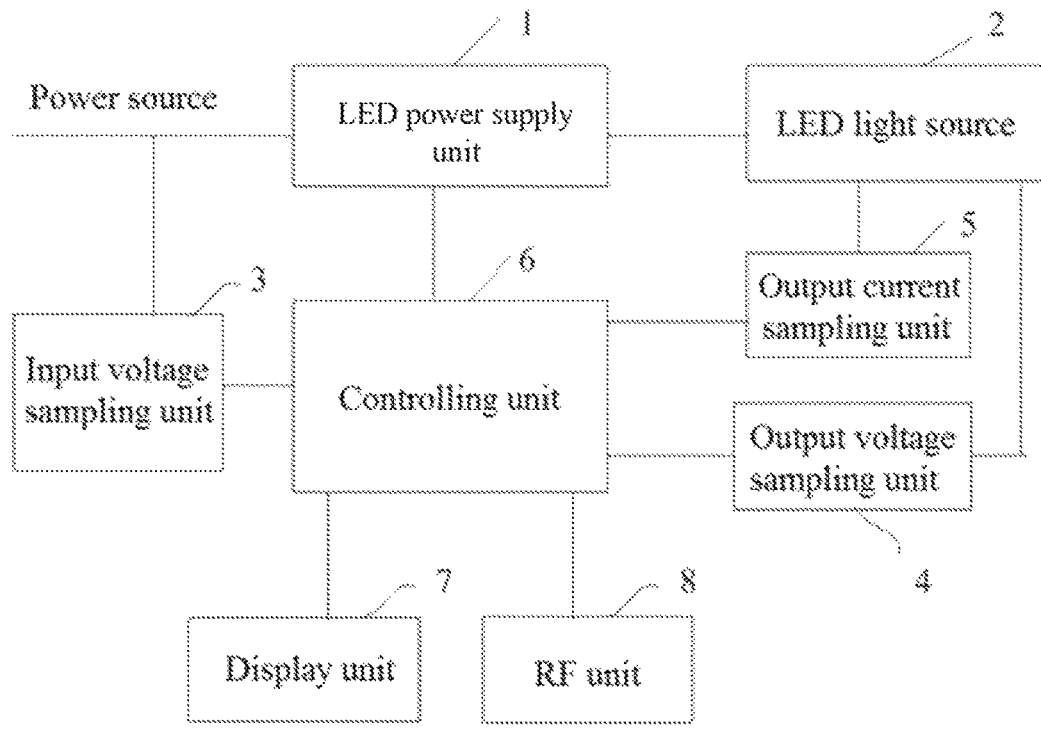
FIG. 1 is an exemplary configuration of an LED lighting device power consumption measurement circuit consistent with various disclosed embodiments.

An exemplary embodiment consistent with the present disclosure is described below. FIG. 1 illustrates an exemplary electrical circuit for measuring the power consumption of an LED lighting device consistent with the present disclosure. The circuit may include an LED power supply unit 1, an LED light source 2, an input voltage sampling unit 3, an output voltage sampling unit 4, an output current sampling unit 5, a controlling unit 6, a display unit 7, and a RF unit 8.

As shown in FIG. 1, the input voltage sampling unit 3, the output voltage sampling unit 4, and the output current sampling unit 5 may be connected to the controlling unit 6. The input voltage sampling unit 3, the output voltage sampling unit 4, and the output current sampling unit 5 may measure the LED input voltage, output voltage, and output current data, respectively in real time, and may send the measured data to the controlling unit 6. The controlling unit 6 may calculate the power consumption of the LED lighting device by using the measured current and voltage data. The calculated power consumption data may be displayed on the display unit 7. The display unit 7 may be placed on the LED lighting device, or may be placed somewhere else by a wired or wireless connection. The controlling unit 6 may also send the calculated real time power consumption data to intelligence user terminals (e.g., a smartphone), or to cloud servers through the RF unit 8. The RF unit 8 may include WiFi modules, Bluetooth modules, and/or Zigbee modules.

The efficiency of an LED lighting device may be defined as follows.

$$\text{eff.} = Po(\text{output power})/Pin(\text{input power})$$

Because the output power $Po = Vo$ (output voltage)$\times Io$ (output current), the efficiency may also be calculated as eff.= $(Vo \times Io)/Pin$. Generally, when the input voltage is a constant, the output power of each type/model of LED lighting devices follows the efficiency curve with small variants.

Figure 2:
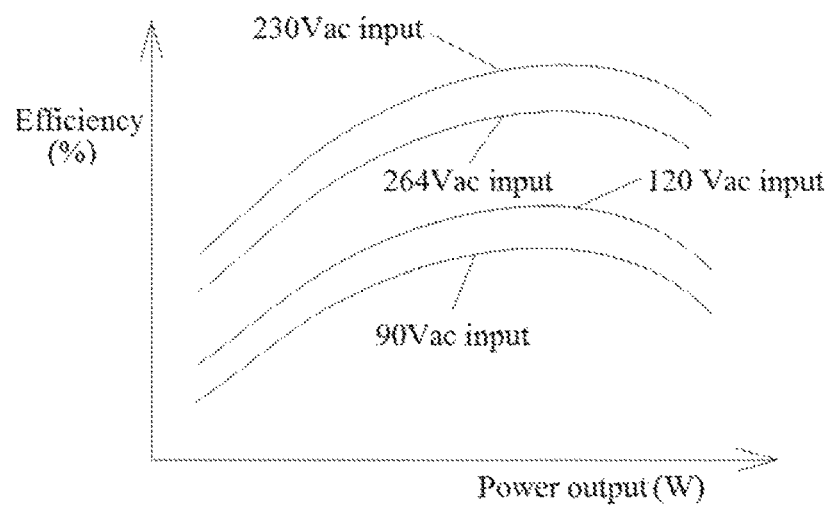
FIG. 2 shows exemplary input voltage-efficiency curves of an LED consistent with various disclosed embodiments.

Further, the efficiency of an LED lighting device may change when the device works under different input voltages, which may be caused by the voltage or current stress change of the main power converting components. As shown in FIG. 2, the input voltage-efficiency curves of a specific LED lighting device may be measured and stored in the controlling unit 6 first. Then, the controlling unit 6 may calculate the real time input power by using the real time voltage and/or current data together with the pre-measured input voltage-efficiency curves of one LED lighting device. In addition, the controlling unit may calculate the input power over time to determine the power consumption of the LED lighting device over a time period.

Figure 3:
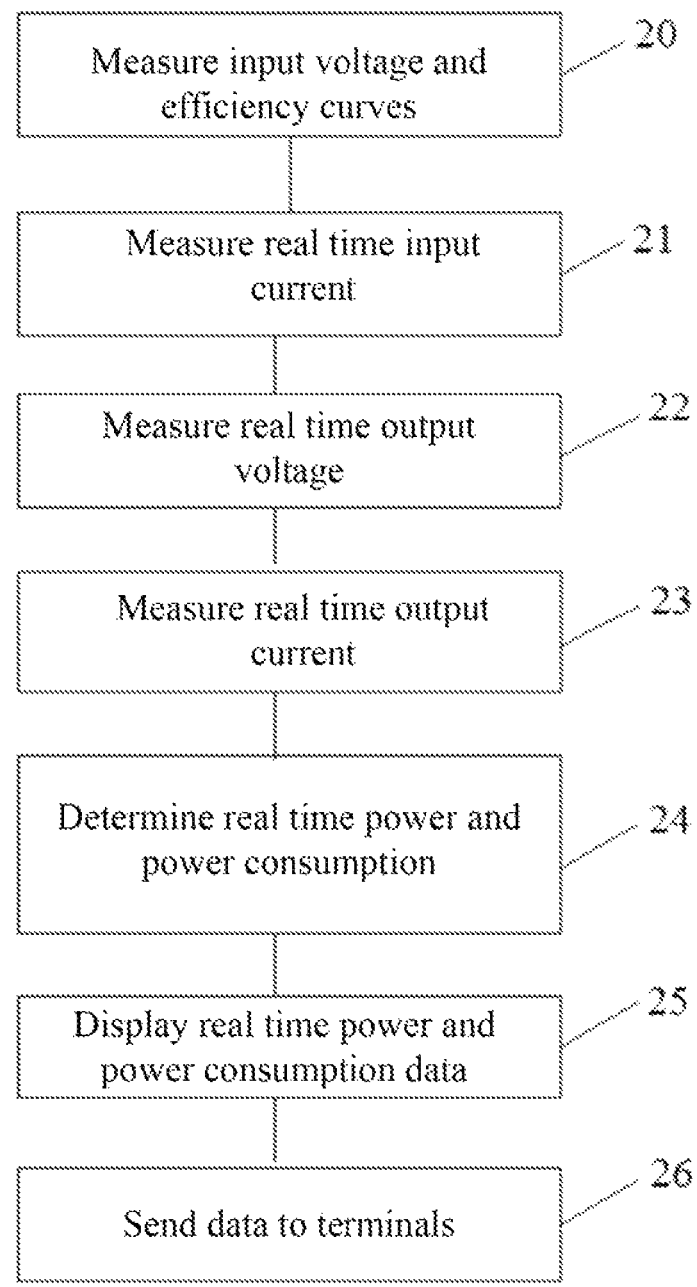
FIG. 3 is a flow chart of an exemplary LED lighting device power consumption measuring method consistent with various disclosed embodiments.

In one embodiment, the process flow for measuring the real time power (instantaneous power) and power consumption (accumulative consumed power over time) of an LED lighting device is as shown in FIG. 3. The method includes steps 20-26.

In step 20, the circuit for measuring power consumption may measure and store the input voltage-efficiency curves of the LED lighting device under different input voltage conditions. In step 21, the circuit may measure the real time input voltage of the LED lighting device by sampling its input voltage data. In step 22, the circuit may measure the real time output voltage of the LED lighting device by sampling its output voltage data. In step 23, the circuit may measure the real time output current of the LED lighting device by sampling its output current data. In step 24, the circuit may calculate the real time input power of the LED lighting device by using the measured voltage/current data, and by referring to and interpolation of the previously stored input voltage-efficiency curves. The circuit may then calculate the real time power consumption by doing time integration. In step 25, the circuit may display the calculated real time power and power consumption data on the display unit. In step 26, the circuit may send the real time LED power and power consumption data to intelligence terminals or cloud servers through the RF unit.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

INDUSTRIAL APPLICABILITY AND ADVANTAGEOUS EFFECTS

Without limiting the scope of any claim and/or the specification, examples of industrial applicability and certain advantageous effects of the disclosed embodiments are listed for illustrative purposes. Various alternations, modifications, or equivalents to the technical solutions of the disclosed embodiments can be obvious to those skilled in the art and can be included in this disclosure.

In some embodiments consistent with the present disclosure, sensors may be attached to an LED lighting device to measure other parameters. For example, light intensity sensors may be placed on the LED lighting device to measure the light intensity of the LED. Humidity and/or temperature sensors may also be arranged on the LED lighting device to measure environmental data over long periods of time.

In some embodiments consistent with the present disclosure, the controlling unit may send the environmental data measurements from attached sensors together with the power and power consumption data to the display unit, to a remote user terminal, or to cloud servers or other terminals through the RF unit. The controlling unit may therefore track the LED lighting device's power and power consumption under various environmental conditions (temperature, humidity, etc.).

In some embodiments consistent with the present disclosure, the controlling unit may receive the LED lighting device's lifespan measurement (e.g., the accumulative time during which the LED has been operating above a defined illuminance level). The controlling unit may track the LED lighting device's power and power consumption together with its accumulated operational time in real time. For example, the controlling unit may send data to a remote user terminal to show the power and power consumption of the LED lighting device over its lifespan. In one example, based on the power and power consumption data and the lifespan data, a user may determine to replace an LED lighting device (even though the lighting device is still operational) if it's power consumption has exceeded a threshold value and that it has been operating for longer than a threshold number of hours.

Embodiments consistent with the present disclosure may use one or multiple sensors to measure light intensity, LED operational conditions, and LED device operational conditions. Further, the controlling unit may keep track of the lifespan data as well as other measures related to the operations of the LED lighting device. The controlling unit may send the data related to the LED operations and other conditions to the display unit and to other remote terminals.

What is claimed is:

1. An electrical circuit for measuring power consumption of an LED lighting device in real time, comprising: an LED power supply unit configured to supply power and drive the LED lighting device; an LED light source configured to emit light; an input voltage sampling unit configured to read real time input voltage data; an output voltage sampling unit configured to read real time output voltage data; an output current sampling unit configured to read real time output current data; an controlling unit, connected to the LED light source via both the output voltage sampling unit and output current sampling unit, and configured to calculate a real time power consumption of the LED lighting device, by using wherein: the real time output current data and the real time output voltage data provide a real time output power, and by referring to previously stored voltage-efficiency curves of the LED lighting device includes a relationship between an efficiency, defined by an output power over an input power, versus the output power, a real time input power is obtained based on the real time output power and the previously stored voltage-efficiency curves, and the real time power consumption is obtained from a time integration of the real time input power; a display unit configured to, during a light adjustment process of the LED lighting device, display the real time power consumption of the LED lighting device based on the calculation of the controlling unit, so as to facilitate a user to determine a corresponding action to the LED lighting device if the real time power consumption of the LED lighting device exceeds a threshold value; and a RF unit configured to receive data and send the received data to remote terminals.

2. The electrical circuit for measuring the power consumption of the LED lighting device according to claim 1, wherein the display unit is connected to the controlling unit through a wired or wireless connection.

3. The electrical circuit for measuring the power consumption of the LED lighting device according to claim 1, wherein the RF unit is connected to the controlling unit.

4. The electrical circuit for measuring the power consumption of the LED lighting device according to claim 1, wherein the RF unit sends real time input power, output power, and power consumption data to intelligent terminals, or to cloud servers.

5. The electrical circuit for measuring the power consumption of the LED lighting device according to claim 1, wherein the controlling unit is further configured to receive and store environmental data measurements taken by sensors on the LED lighting device.

6. The electrical circuit for measuring the power consumption of the LED lighting device according to claim 5, wherein the controlling unit is further configured to send the environmental data measurements to the display unit.

7. The electrical circuit for measuring the power consumption of the LED lighting device according to claim 1 wherein the display unit is further configured to display the power consumption data together with the environmental data.

8. The electrical circuit for measuring the power consumption of the LED lighting device according to claim 1, wherein the controlling unit is further configured to receive and store data measuring a lifespan of the LED lighting device in real time.

9. The electrical circuit for measuring the power consumption of the LED lighting device according to claim 8, wherein the controlling unit is further configured to send the data measuring the real time lifespan of the LED lighting device to the display unit.

10. The electrical circuit for measuring the power consumption of the LED lighting device according to claim 9, wherein the display unit is further configured to display the power consumption data together with the data measuring the real time lifespan of the LED lighting device.

11. A method for measuring power consumption of an LED lighting device in real time, comprising: measuring input voltages and voltage-efficiency curves of the LED lighting device under different input voltage conditions; storing, by a controlling unit, the input voltage-efficiency curves of the LED lighting device under different input voltage conditions; measuring real time input voltage of the LED lighting device; measuring real time output voltage of the LED lighting device; measuring real time output current of the LED lighting device; determining real time input power of the LED lighting device, by using wherein: the real time output current data and the real time output voltage data provide a real time output power, and by referring to previously stored voltage-efficiency curves of the LED lighting device includes a relationship between an efficiency, defined by an output power over an input power, versus the output power, and a real time input power is obtained based on the real time output power and the previously stored voltage-efficiency curves; determining the real time power consumption by doing a time integration of the real time input power; and displaying, by a display unit, during a light adjustment process of the LED lighting device, the power and power consumption of the LED lighting device in real time, so as to facilitate a user to determine a corresponding action to the LED lighting device if the real time power consumption of the LED lighting device exceeds a threshold value.

12. The method for measuring the power consumption of the LED lighting device according to claim 11, wherein the displaying unit is attached to or a part of the LED lighting device.

13. The method for measuring the power consumption of the LED lighting device according to claim 11, further comprising: sending the calculated real time power and power consumption data to an intelligent terminal through a RF unit.

14. The method for measuring the power consumption of the LED lighting device according to claim 13, further comprising: displaying the real time power and power consumption data on the intelligent terminal.

15. The method for measuring the power consumption of the LED lighting device according to claim 11, further comprising: measuring environment data related to operational conditions of the LED lighting device; and displaying the environmental data together with the power and power consumption data of the LED lighting device.

16. The method for measuring the power consumption of the LED lighting device according to claim 11, further comprising: measuring real time lifespan data of the LED lighting device; and displaying the real time lifespan data together with the power and power consumption data of the LED lighting device.

17. A system for measuring power consumption of an LED lighting device in real time, further comprising: an LED power supply unit configured to supply power and drive the LED lighting device; an LED light source configured to emit light; an input voltage sampling unit configured to read real time input voltage data; an output voltage sampling unit configured to read real time output voltage data; an output current sampling unit configured to read real time output current data; a temperature sensor and a humidity sensor attached to the LED lighting device, collecting environmental data related to operations of the LED lighting device in real time; a controlling unit configured to calculate a real time power and power consumption of the LED lighting device, by using wherein: the real time output current data and the real time output voltage data provide a real time output power, and by referring to previously stored voltage-efficiency curves of the LED lighting device includes a relationship between an efficiency, defined by an output power over an input power, versus the output power, a real time input power is obtained based on the real time output power and the previously stored voltage-efficiency curves, and the real time power consumption is obtained from a time integration of the real time input power; a display unit configured, during a light adjustment process of the LED lighting device, to display the real time environment data and the power and power consumption of the LED lighting device, so as to facilitate a user to determine a corresponding action to the LED lighting device if the real time power consumption of the LED lighting device exceeds a threshold value; and a RF unit configured to receive and send received data to remote terminals.

18. The system for measuring the power consumption of an LED lighting device in real time according to claim 17, further comprising a light intensity sensor configured to measure illuminance of the LED light source in real time; wherein the controlling unit is further configured to determine a lifespan of the LED lighting device based on the illuminance measurements.

19. The system for measuring the power consumption of an LED lighting device in real time according to claim 18, wherein the display unit is further configured to display the real time lifespan data with the power and power consumption data of the LED lighting device.

\* \* \* \* \*